US008013384B2

(12) United States Patent
Arena et al.

(10) Patent No.: US 8,013,384 B2
(45) Date of Patent: Sep. 6, 2011

(54) METHOD FOR MANUFACTURING A HIGH INTEGRATION DENSITY POWER MOS DEVICE

(75) Inventors: Giuseppe Arena, Catania (IT); Giuseppe Ferla, Acicastello (IT); Marco Camalleri, Catania (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 140 days.

(21) Appl. No.: 12/551,999

(22) Filed: Sep. 1, 2009

(65) Prior Publication Data

US 2009/0321826 A1     Dec. 31, 2009

Related U.S. Application Data

(62) Division of application No. 11/285,742, filed on Nov. 21, 2005, now Pat. No. 7,601,610.

(30) Foreign Application Priority Data

Nov. 19, 2004   (IT) .............................. MI2004A2243

(51) Int. Cl.
*H01L 21/00*        (2006.01)
(52) U.S. Cl. . 257/327; 257/330; 257/342; 257/E21.388; 257/E21.444; 257/E29.134
(58) Field of Classification Search .................. 257/153, 257/327–342, E21.388, 418, 44, 29.066, 257/115, 134, 257
See application file for complete search history.

(56) References Cited

U.S. PATENT DOCUMENTS

| | | |
|---|---|---|
| 4,145,700 A | 3/1979 | Jambotkar |
| 4,318,759 A | 3/1982 | Trenary et al. |
| 4,748,103 A * | 5/1988 | Hollinger .................. 430/314 |
| 5,254,494 A | 10/1993 | Van der Plas et al. |
| 5,445,978 A | 8/1995 | Yimaz |

(Continued)

FOREIGN PATENT DOCUMENTS

JP        082965       3/1997

(Continued)

OTHER PUBLICATIONS

European Search Report for European Application No. EP 05 02 5287, dated May 29, 2006, conducted in Munich.

(Continued)

*Primary Examiner* — Michael S Lebentritt
(74) *Attorney, Agent, or Firm* — Lisa K. Jorgensen; Kevin D. Jablonski; Graybeal Jackson LLP

(57) ABSTRACT

A process for the realization of a high integration density power MOS device includes the following steps of: providing a doped semiconductor substrate with a first type of conductivity; forming, on the substrate, a semiconductor layer with lower conductivity; forming, on the semiconductor layer, a dielectric layer of thickness comprised between 3000 and 13000 A (Angstroms); depositing, on the dielectric layer, a hard mask layer; masking the hard mask layer by means of a masking layer; etching the hard mask layers and the underlying dielectric layer for defining a plurality of hard mask portions to protect said dielectric layer; removing the masking layer; isotropically and laterally etching said dielectric layer forming lateral cavities in said dielectric layer below said hard mask portions; forming a gate oxide of thickness comprised between 150 and 1500 A (Angstroms) depositing a conductor material in said cavities and above the same to form a recess spacer, which is totally aligned with a gate structure comprising said thick dielectric layer and said gate oxide.

15 Claims, 6 Drawing Sheets

U.S. PATENT DOCUMENTS

| | | | |
|---|---|---|---|
| 5,510,281 | A | 4/1996 | Ghezzo et al. |
| 5,731,604 | A * | 3/1998 | Kinzer .................... 257/153 |
| 5,814,859 | A | 9/1998 | Ghezzo et al. |
| 5,933,734 | A | 8/1999 | Ferla et al. |
| 5,981,343 | A | 11/1999 | Magri et al. |
| 6,025,230 | A * | 2/2000 | Hshieh et al. ............. 438/268 |
| 6,215,152 | B1 | 4/2001 | Herbert |
| 6,222,232 | B1 | 4/2001 | Magri et al. |
| 6,326,271 | B2 | 12/2001 | Magri et al. |
| 6,423,986 | B1 | 7/2002 | Zhao |
| 6,596,609 | B2 | 7/2003 | Cheng et al. |
| 6,979,863 | B2 | 12/2005 | Ryu |
| 2002/0093033 | A1 | 7/2002 | Zommer et al. |
| 2002/0140042 | A1 | 10/2002 | Stout |
| 2003/0057497 | A1 | 3/2003 | Higashida et al. |
| 2004/0031981 | A1 | 2/2004 | Grivna |
| 2004/0142531 | A1 | 7/2004 | Chan et al. |
| 2004/0185646 | A1 | 9/2004 | Herzum |
| 2005/0145852 | A1 | 7/2005 | Kumar et al. |
| 2005/0224869 | A1 * | 10/2005 | Lin et al. .................... 257/330 |
| 2006/0086974 | A1 | 4/2006 | Balakrishnan |

FOREIGN PATENT DOCUMENTS

WO    WO9933119    7/1999

OTHER PUBLICATIONS

K. Shenai, "Selectively silicided vertical power double-fiffused metal-oxide semiconductor field effect transistors for high-frequency power switching applications", Journal of Vacuum Science & Technology, Nov./Dec. 1988, No. 6, New York, US.

European Search Report for European Application No. EP 05 02 5288, dated Feb. 21, 2006, conducted in Munich.

Wayne Burger, "RF-LDMOS: A Device Technology for High Power RF Infrastructure Applications", 2004 IEEE CSIC Digest.

"Mask-Independent Short Channel MOS"; IBM Technical Disclosure Bulletin, vol. 21, No. 12, May 1979.

* cited by examiner

METHOD FOR MANUFACTURING A HIGH INTEGRATION DENSITY POWER MOS DEVICE

PRIORITY CLAIM

The present application is a Divisional of U.S. patent application Ser. No. 11/285,742, filed Nov. 21, 2005, currently pending; which claims priority from Italian patent application No. MI2004A 002243, filed Nov. 19, 2004, which is incorporated herein by reference.

CROSS REFERENCE TO RELATED APPLICATIONS

This application is related to U.S. patent application Ser. No. 11/285,741 entitled POWER MOS ELECTRONIC DEVICE AND CORRESPONDING REALIZING METHOD and Ser. No. 11/285,759 entitled SWITCHING-CONTROLLED POWER MOS ELECTRONIC DEVICE, which have a common filing date and owner and which are incorporated by reference.

TECHNICAL FIELD

The present invention relates to a process for the realization of a high integration density power MOS device.

BACKGROUND

As it is well known, power MOS devices, especially low voltage ones, have been characterised, especially during the last years, by a continuous increase of the integration density of transistor elementary structures, following a process of dimension reduction, so called "scaling down" typical of integration techniques so called "Very Large-Scale Integration" (VLSI).

In transistor elementary structures, this has implied the use of thinner and thinner gate oxides, shallower and shallower junctions, and shallower and shallower channel lengths. Power MOS devices formed by completely submicrometric transistor elementary structures are, nowadays, a reality present on the market.

This technological development proceeds from the application need of having smaller and smaller output resistances from transistor elementary structures and higher and higher switching speeds.

The need is even more important when driving power MOS devices, with lower and lower gate voltages, so as to allow the corresponding driving circuits [driver] a low voltage output (1.8-2.5 Volt).

From the technological viewpoint the previously exposed necessities result in the need of suitably designing the transistor elementary structure, whose repetition will constitute the power MOS device. In particular, the gate dielectric thickness, typically silicon oxide, is more and more reduced so as to obtain threshold voltage values lower than a volt without deteriorating the breakdown characteristics of the MOS device due to a possible punch through effect of the channel whose length is more and more reduced.

However, this implies drawbacks. For example, in terms of switching speed, the reduction of the gate dielectric thickness, together with the higher integration density, implies an increase of the MOS device capacitances and thus a slow-down in the switching speed. Moreover, the switching speed does not exclusively depend on the capacitance but also on the resistance seen from the driver for loading and unloading the capacitive elements of the power MOS device. Such resistance takes the name of inner gate resistance and it depends on the physical and geometrical characteristics of the group of all the elementary structures.

In particular, FIG. 1 schematically shows an equivalent electric circuit of 1 of n elementary MOS transistors Ti (i= 1 ... n) in parallel, which constitute a power MOS device. Such elementary transistors have a common control terminal Gate and common conduction terminals Drain and Source. This circuit also shows a gate biasing network wherein the resistive contribution brought by inner resistances Ri (i= 1 ... n) of the n elementary MOS transistors Ti constituting the power MOS device is highlighted.

All in all, for improving the dynamic performances of a power MOS device, as the one shown for example in FIG. 1, it is necessary to reduce to the minimum not only the total gate capacitance but also the resistance thereof, determined by the contribution of the resistances Ri, so as to reduce the time constant (RC), given by the product between the total gate resistance by the device capacitance.

So far the known technique has been oriented on technological and circuit innovation paths to separately solve the problems correlated to the minimization of the gate capacitance and resistance of a power MOS device.

A first known solution, turned towards minimizing the capacitance, consists in integrating, in MOS technologies, gate dielectrics different from thermal $SiO_2$ such as for example, hafnium oxide, aluminium oxide, multilayers of silicon oxide/silicon nitride, etc.

However, the activities linked to the adoption of alternative materials are long and subject to tests which could require prohibitive times for the current market of the devices at issue, making a solution to the highlighted problem not attainable.

A second known solution, turned towards minimizing the capacitance, by increasing the switching speed of the device, provides a change of the geometry of the single transistor elementary structure of the power MOS device. In particular, this structure is changed in the gate dielectric in active area, which is realized with two layers having different thickness:

a first relatively thin layer is realized on the source channel, so as to make a driving of the low threshold voltage MOS device possible;

another layer of greater thickness is realized so that it is extended to the sole region of the gate/drain capacitor (intercell), so as to remarkably reduce the transition capacitance of the MOS device.

A technique for realizing power VDMOS devices with vertical diffusion, both with channel n, and with channel p, and with double gate oxide thickness in active area, is described in the U.S. Pat. Nos. 6,222,232 and 6,326,271 and the resulting structure is shown in FIG. 2, globally indicated with 2 and wherein source, body and drain regions are respectively indicated with 13, 12 and 11.

In this technique, the definition procedure of the gate electrode mainly requires a thermal growth of a silicon oxide thick film OX, its photolithographic definition in active area regions, the successive growth of a thin gate oxide film OXG which will surmount a channel ch. The deposition of a gate poly electrode (doped polysilicon or polysilicon stack/metallic silicide) and the definition of the gate geometries through suitable phototechnique maskings then follow.

The rest of the process is that typical of a vertical diffusion power MOS, with realization of a channel through lateral diffusion of a well (of the p type in a channel n device and of the n type in the device of opposite polarity), and of a small heavily doped source well, opening through phototechnique of source and gate contacts, and front and rear metallization of the so called "semiconductor slice", which substantially represents the substrate whereon the MOS is integrated.

Unfortunately, the prior art for the realization of a gate with double oxide thickness, of a transistor elementary structure of power MOS devices, clashes on the growing need of increasing the integration density however safeguarding the alignment of the planar structures in active area. In fact, the prior art provides the use of a photolithography to define the thick oxide region OX in the transistor elementary structure and of a successive and more delicate photolithography step for the definition of the gate poly electrode geometry.

The need of having a symmetrical and uniform diffused channel imposes, in this case, a great margin between the delimitation of the gate electrode, whose projection is indicated with A in FIG. 2, and the edge of the structure in central thick oxide OX, whose projection is indicated with B in FIG. 2.

A margin indicated with L in FIG. 2 must be sufficiently wide as to ensure that possible maximum misalignments in the lithographic definition of the gate poly electrode do not determine a channel extension $L_{ch}$ under the thick oxide OX however in an asymmetrical way.

Obviously, the presence of this margin reduces the integration density of the device on semiconductor.

In the prior art there exist "self-aligning" methods able to reduce the above margin L and based on the formation of spacers realized at the edges of the thick oxide, as well highlighted in FIG. 3, wherein source, body and drain regions will be indicated as in FIG. 2. FIG. 3 shows a structure 3 with double self-aligning gate thickness of power VDMOS devices. This structure has two VDMOS devices, indicated with T1 and T2, having a first gate dielectric thickness, indicated respectively with OXG1 and OXG2 and a second gate dielectric thickness, indicated respectively with OX1 and OX2.

Opposite spacers SP delimit an opening IN, through which the plants for the formation of body wells are realized, from the start of the thick oxide OX1 and OX2. A margin L', comprised between the projection B' of an end of the opening IN through which the plants for the formation of body wells are realized and the projection A' of the end of the thick oxide OX1 nearer to the opening IN, is lower than the margin D1 shown in FIG. 2.

Unfortunately, also these self-aligning methods of the known type have serious drawbacks; being based on anisotropic etchings, they tie the margin L' between the openings through which the plants for the formation of body wells are realized and the start of the thick oxide, to the thickness of the polysilicon or dielectric layers used for their realization.

The thickness of these layers being normally lower than the micrometer it follows that also this margin L', and, in particular, the channel length $L'_{ch}$, will be lower than the micrometer. If on one side this represents an advantage for the submicrometric structures used in low voltage applications, this fact represents a limit for the technologies destined to high voltage applications since channel lengths $L'_{ch}$ lower than the micrometer can trigger premature breakdown problems.

Other techniques being known in the literature, for example as described in the U.S. Pat. No. 5,933,734, are orientated on technological and circuit innovation paths, to solve the problems correlated with the minimization of the gate resistance of a power MOS device. The structure is realized with the technique described in the cited patent is shown in FIG. 4, wherein source, body and drain regions will be indicated as in FIGS. 2 and 3, also overlapped onto a substrate 10. Therein, a gate mesh comprising gate electrodes EGi (i=1 . . . n) is realized with a suitably doped polysilicon pls layer placed in parallel to a metal or metallic silicide sic, at a lower resistivity with respect to the polysilicon.

The technical problem is that of defining a process for realizing a high integration density power MOS device, with a gate electrode having double oxide thickness, having such structural characteristics as to be used also in technologies with scale dimensions VLSI, but with channel dimensions being not necessarily submicrometric, overcoming the limits and/or the drawbacks of the prior art.

SUMMARY OF THE INVENTION

According to one aspect of the present invention, a high integration density power device with a structure having double gate thickness and being totally self-aligned with the gate electrode.

More specifically, an aspect of the invention relates to a process for the realization of a high integration density power MOS device comprising the steps of:
providing a doped semiconductor substrate with a first type of conductivity;
forming, on the substrate, a semiconductor substrate with lower conductivity;
forming, on said semiconductor layer, a dielectric layer of thickness comprised between 3000 and 13000 A (Angstroms);
depositing, on said dielectric layer, a hard mask layer;
masking the hard mask layer by means of a masking layer;
etching the hard mask layers and the underlying dielectric layer to define a plurality of hard mask portions to protect said dielectric layer; removing the masking layer.

The characteristics and the advantages of the process according to the invention will be apparent from the following description of an embodiment thereof given by way of indicative and non limiting example with reference to the annexed drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 5:
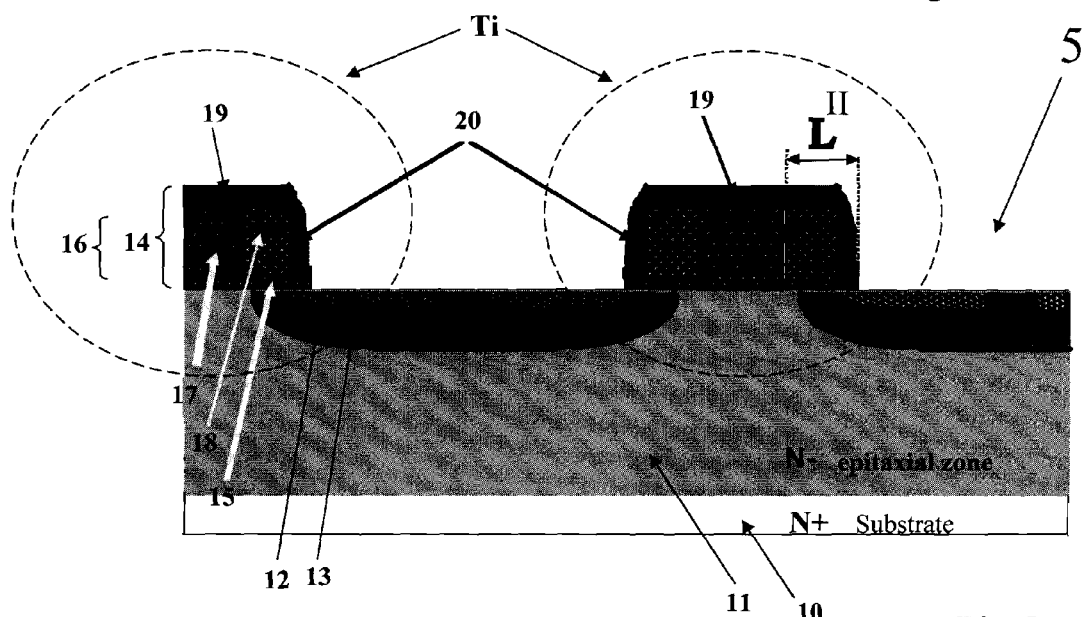
FIG. 5 shows an enlarged vertical section view of a layered structure of a power MOS device in a first embodiment of the present invention.

With reference to these figures, and in particular to the example of FIG. 5, an enlarged vertical section view is shown of a high integration density power MOS device, comprising transistor elementary structures, according to a first embodiment of the present invention, is globally and schematically indicated with 5.

The power device 5 essentially comprises a heavily doped semiconductor substrate of the N type (N+) to ensure the conduction and resistance characteristics in voltage of the desired power device.

On this substrate a second doped semiconductor layer of the N type is grown (N−) with lower conductivity with respect to the first layer.

Figure 2:
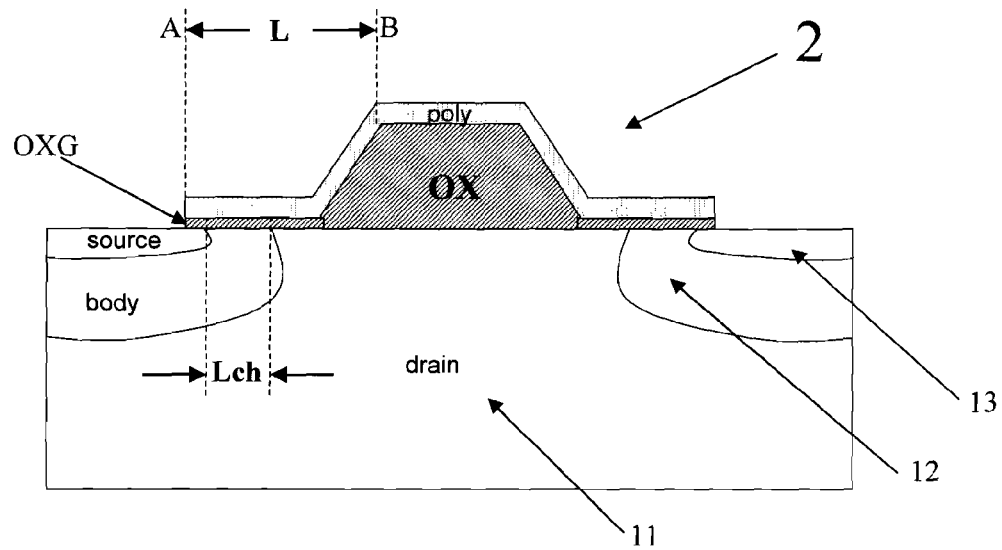
FIG. 2 shows an enlarged vertical section view of a first layered structure of a power MOS device according to the prior art.
Figure 3:
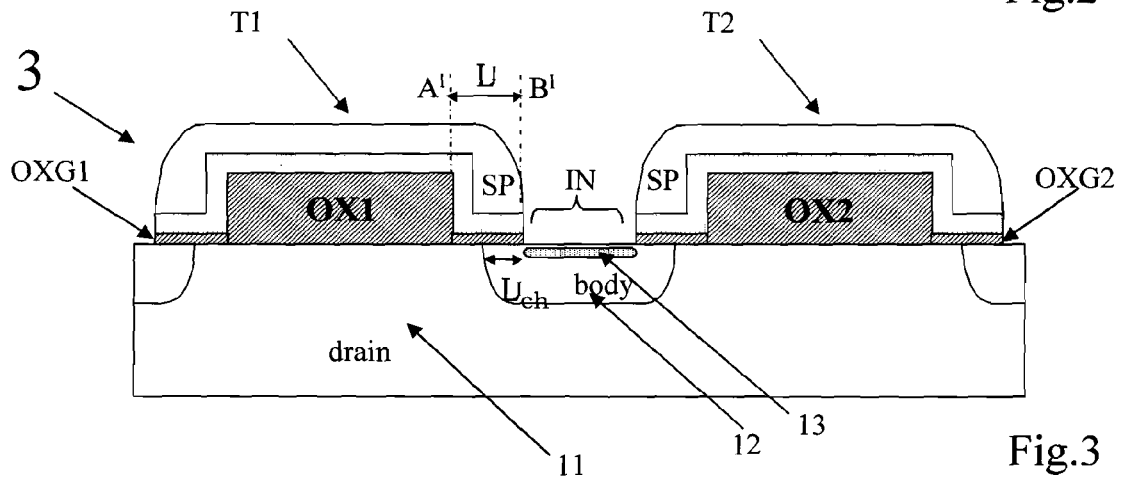
FIG. 3 shows an enlarged vertical section view of a second layered structure of a power MOS device according to the prior art.
Figure 4:
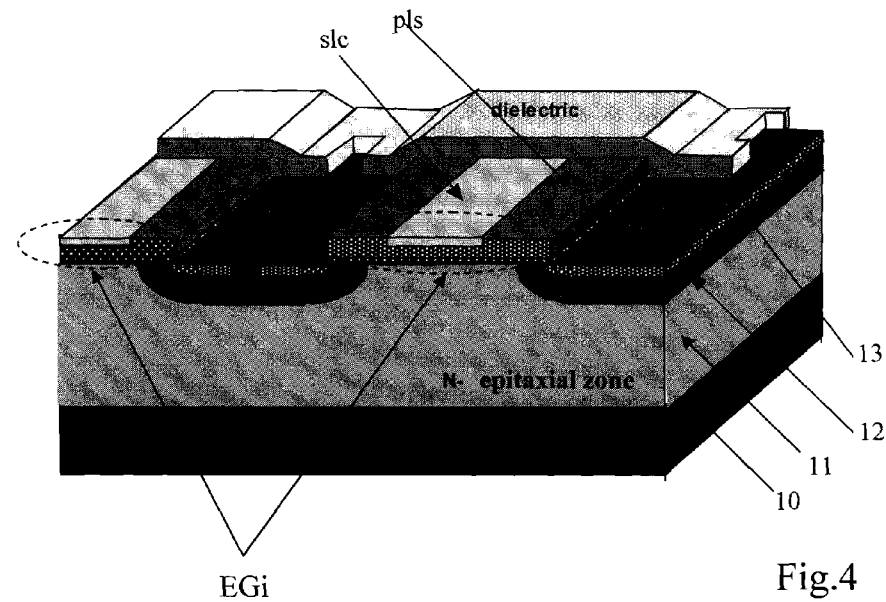
FIG. 4 shows an enlarged perspective view of a third layered structure of a power MOS device according to the prior art.

As it has been seen in relation with the prior art, in particular with reference to FIGS. 2 and 3, the conductor layer 11 serves as drain region of the power device 5; transistor elementary structures Ti (i=1 ... n) comprise a body region 12 within which the source well 13 is realized and completely confined.

Suitably, the transistor elementary structures Ti (i=1 ... n) have gate structures 14 of the type with double thickness, which comprise a first gate oxide thin layer 15, above which a dielectric layer 16 is centrally present having greater thickness with respect to the first layer 15. This layer of greater thickness defines a central portion 17 delimited by polysilicon lateral portions 18.

Figure 1:
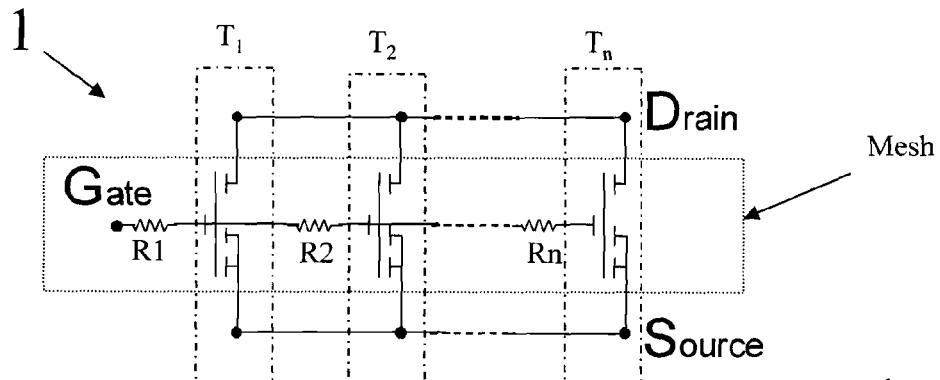
FIG. 1 schematically shows an equivalent electric circuit of a power MOS device according to the prior art.

A so called conductor polysilicon mesh realizes the connection of all the elementary transistors Ti to define the high integration density power MOS device 5, as schematically shown in the prior art description, with reference to FIG. 1.

Suitably, but without this representing a limit for the scope of this embodiment of the present invention, the central portion 17 of thick dielectric is realized with a thermally grown silicon oxide; alternatively, it can be realized with a sequence of suitable layers such as, for example, multilayers of SixOy/SiwNz or SixOyNz.

Advantageously according to an embodiment of the invention, the gate structure 14 further comprises an upper nitride portion 19, arranged above the thick dielectric central portion 17 of the transistor mesh and of the polysilicon lateral portions 18; this nitride portion 19 insulates the entire upper base surface of the above portions 17 and 18.

Advantageously according to an embodiment of the invention, the gate structure 14, surmounted by the nitride portion 19, is flanked by two spacers 20 of conductive material, arranged so as to cover, with their own base, the opposite ends of the upper surface of the first thin layer 15 of gate oxide, left free since not overlapped neither by the thick dielectric central portion 17 of the transistor mesh nor by the lateral polysilicon portions 18.

Advantageously according to an embodiment of the invention, the two spacers 20 of conductive material serve as gate electrode. Suitably, but without this representing a limit for the present embodiment, the above spacers 20 are realized with suitably doped polysilicon; alternatively, they can be realized with metal.

Advantageously according to an embodiment of the invention, the presence of the two spacers 20 allows a self-alignment of the gate structure 14 and of the body 12 and source 13 regions, facilitating the definition of the photolithography which realizes the initial thick dielectric structure, as it will be shown in detail in the description of a process for realizing the high integration density power MOS device.

Figure 6:
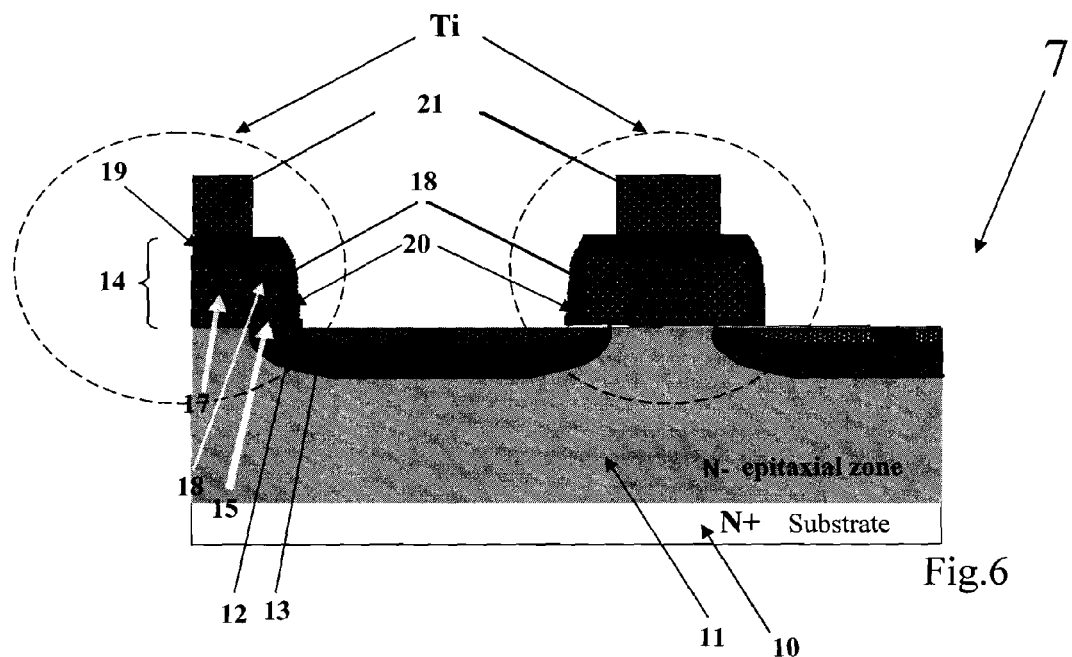
FIG. 6 shows an enlarged vertical section view of a layered structure of a power MOS device in a second embodiment of the present invention.
Figure 7:
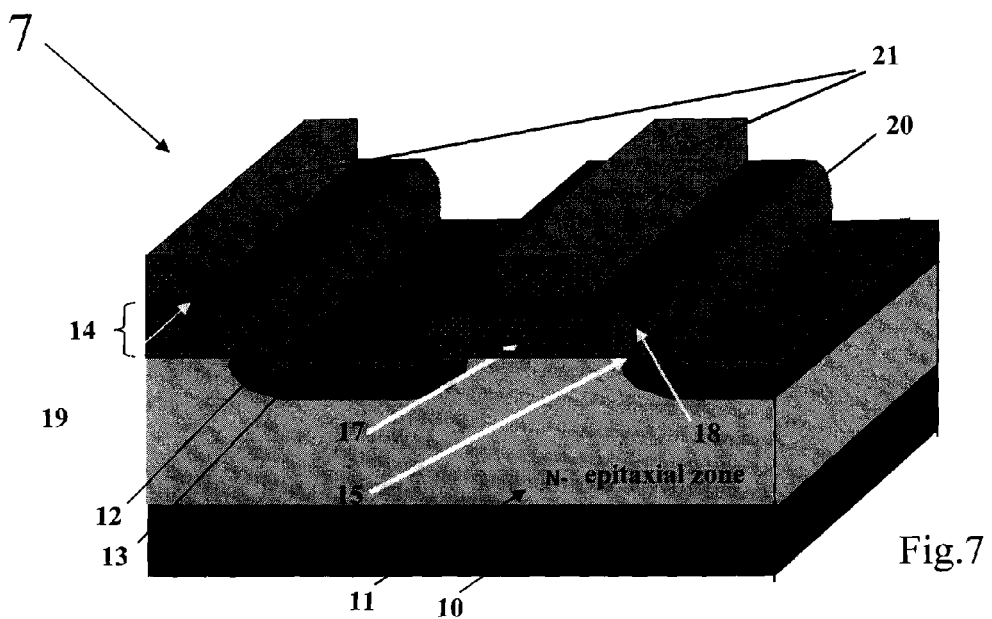
FIG. 7 shows an enlarged perspective view of the structure of FIG. 6.

Advantageously, with reference to FIGS. 6 and 7 which show a high integration density power MOS device comprising transistor elementary structures $T_i$ it can be realized by separating the gate structure 14 from a transmission conductive layer 21 of the transistor mesh, by means of the nitride portion 19 according to a second embodiment of the present invention.

Such a device is shown in a section and perspective view, respectively in FIGS. 6 and 7, globally and schematically indicated with 7. In both figures, components common to FIG. 5 will be described with the same reference identifiers.

Advantageously according to one embodiment of the invention, the transmission conductive layer 21 has, in this case, the sole function of transmission line, i.e., it distributes the biasing signal to the elementary structures Ti composing the high integration density power MOS device.

Suitably, without this representing a limit for the present embodiment, this transmission conductive layer 21 is realized in polysilicon.

Advantageously, according to one embodiment of the invention, the transmission conductive layer 21, placed above a dielectric layer 16 being much thicker than the gate oxide, can be made very conductive both by hyper-doping and entirely transforming it into a metallic layer, without jeopardizing the faultiness of the spacer 20 serving as gate electrode.

The transmission conductive layer 21, in particular, can be realized with a silicide layer occupying the whole thickness of the initial polysilicon either with a metallic layer overlapped onto the polysilicon layer or with a completely metallic layer.

Figure 8:
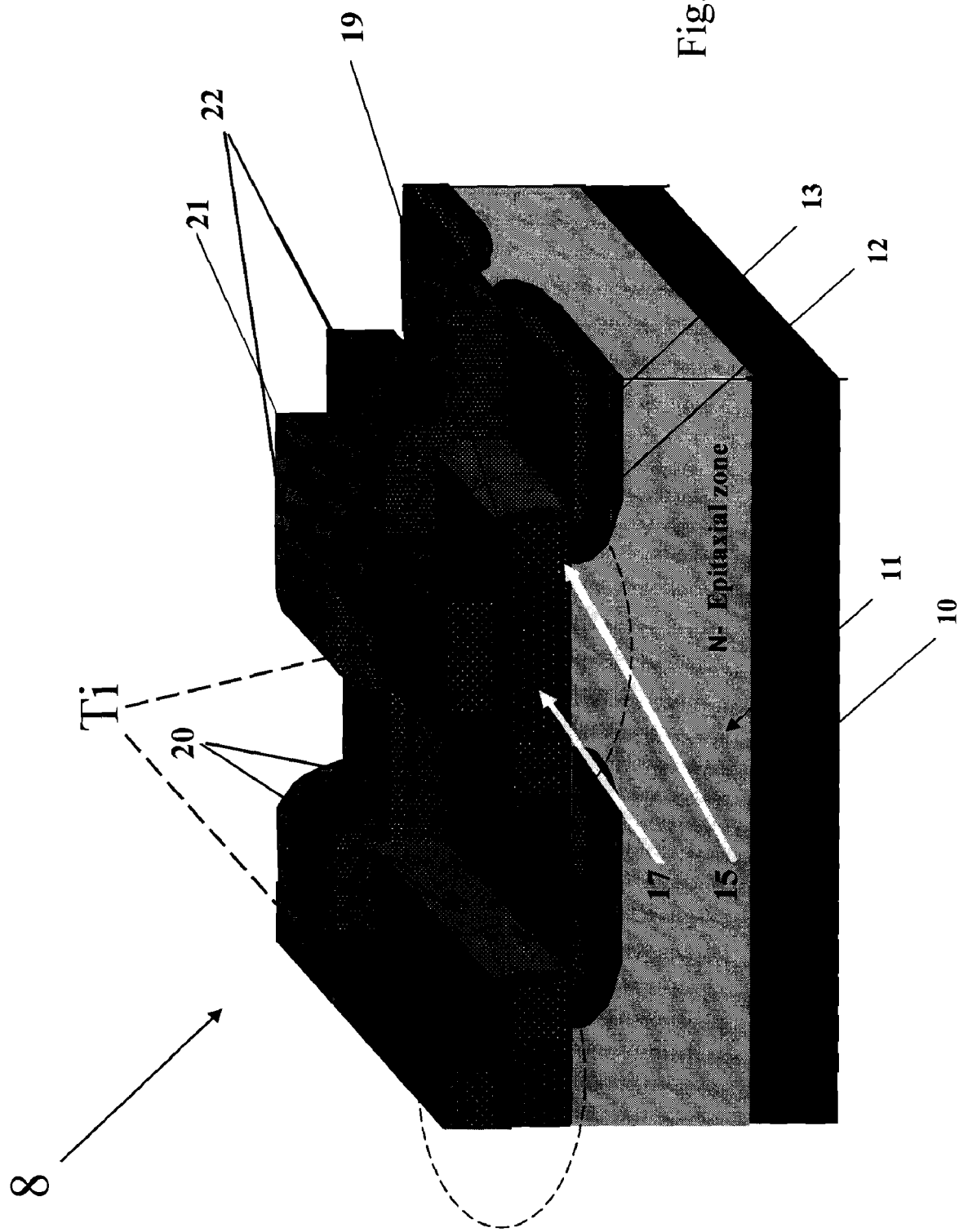
FIG. 8 shows an enlarged perspective view of an evolution of the structure of FIG. 6.

Suitably, the transmission conductive layer 21 of the transistor mesh and the spacer 20 serving as gate electrode must be electrically connected and this can easily occur by creating a polysilicon connection bridge 22 as shown in FIG. 8; in this figure, components and signals common to FIGS. 7 and 6 will maintain the same reference identifiers.

The speed of the device and the propagation mode of the driving signal will depend on the number of polysilicon connection bridges 22 and on their mutual distance.

Summarizing, one embodiment of the invention provides the deposition, above the thick oxide 16, of a polysilicon layer 21, suitably doped and of suitable thickness. By exploiting the high conformability of said polysilicon layer, the cavities left from the preceding dielectric lateral etching are filled in.

An anisotropic etching follows of the polysilicon 21, suitably masked by means of photolithographic techniques, follows so as to form a spacer of said material which, having filled in the pre-existing cavities, takes the name of recess spacer 20.

Simultaneously, the use of lithographic techniques allows to define both polysilicon paths overhanging the thick dielectric 16 (gate electrode on thick dielectric), and interconnection bridges 22, always in polysilicon, between the overhanging areas of the thick dielectric 16 and the areas with gate oxide, i.e., gate electrode on thin oxide.

The area below the recess spacer 20 is advantageously used for the formation of the channel.

The aforesaid polysilicon bridges 22 allow distribution of the signal propagated through the gate electrode on the thick dielectric towards the gate electrode on the thin oxide.

With this embodiment of the invention, self-alignment between the area of laterally etched thick dielectric 16 and the channel area is allowed.

A process will be now described for the realization of the high integration density power MOS devices 5 and 7, in the various realization steps, shown in FIGS. 9 to 14.

The process steps and the structures described hereafter do not form a complete process flow for the realization of high integration density power MOS devices. In fact, embodiments of the present invention can be put into practice together with the techniques for realizing MOS devices currently used in the field and hereafter only the process steps necessary for the comprehension of embodiments of the invention are described.

According to embodiments of the present invention, the process for the realization of high integration density power MOS devices includes the following steps: Providing a doped semiconductor substrate 10 of the N type and with high conductivity and subsequently growing a further doped semiconductor layer 11 of the N type, with lower conductivity (N−); forming a thick dielectric layer 16 of thickness comprised for example between 3000 and 13000 A (Angstroms); Suitably, but not limitatively, this dielectric of greater thickness 16 is realized with thermally grown silicon oxide; alternatively, it can be realized with a sequence of suitable layers such as, for example, multilayers of SixOy/SiwNz or SixOyNz. Depositing, above the thick dielectric layer 16 a so called hard mask of thickness comprised between 150 and 1000 A (Angstroms); Suitably, but not limitatively, this hard mask is realized with a silicon nitride layer; alternatively, it can be realized with polysilicon; providing a masking, by positioning a resist layer, of the nitride layer to define a plurality of nitride portions 19 to protect the underlying thick dielectric layer 16; etching in an anisotropic way (i.e., dry etching) the nitride layer and the underlying thick dielectric 16; removing the resist; etching, laterally and in an anisotropic way, the thick dielectric layer 16 for a lateral thickness comprised between 2000 and 6000 A (Angstroms).

This etching step allows laterally etching the thick dielectric layer 16 with respect to the nitride portions 19 used as a hard mask. The process must be carried out so as to ensure a high etching selectivity between the thick dielectric layer 16 and the nitride portions 19 used as the hard mask.

Figure 9:
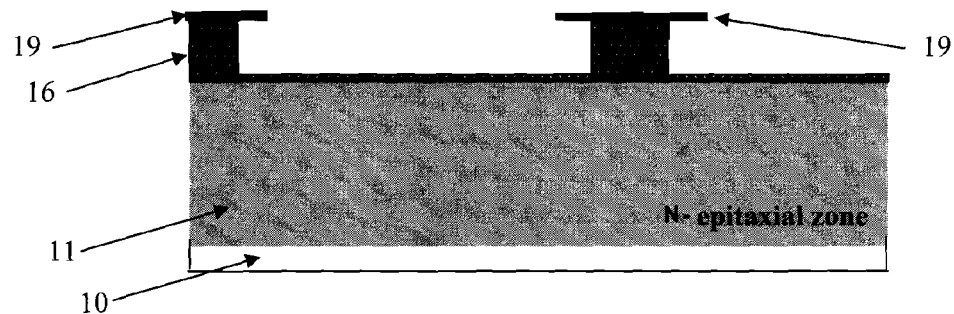
FIG. 9 shows an enlarged vertical section view of a layered structure of a power MOS device in a step of a process for realizing the device according to an embodiment of the present invention.

An enlarged vertical section view of a layered structure of a high integration density power MOS device realized at the end of the oxide lateral etching step is shown in FIG. 9, wherein it is evident that the process leads to the formation of a T-like structure with creation of opposite cavities [undercut] under the nitride portions 19.

Suitably, the lateral etching step can be realized by means of chemical solutions based on hydrofluoric acid or chemical solutions based on phosphoric acid or with a suitable isotropic etching in dry.

By way of example, a lateral etching step can be realized by means of an etching "in wet" with solutions based on hydrofluoric acid HF. By using for example BOE solutions (Buffered Oxide Etcher) with HF and NH4F in proportion 1 to 7 (HF:NH4F=1:7) at 28° C., there is an etching speed of 950 A/min and an etching unevenness of 5%. This allows good control of the recession of the thick dielectric layer 16 with respect to the overhanging nitride portions 19, given that the nitride is not etched in solutions based on HF.

The process provides further steps of: Thermally growing a gate oxide 15 of thickness comprised between 150 and 1500 A (Angstroms); depositing conductive material 24, in particular polysilicon in the cavities realized below the nitride portions 19 and above the same, with formation of a recess spacer 20, suitable to allow the total alignment between the structure with double gate thickness and the gate electrode.

Hereafter in the description, reference will be made, not limitatively, to polysilicon 24, this meaning, more in general, a conductive material; subsequently a possible doping of the deposited polysilicon 24 can be provided.

Figure 10:
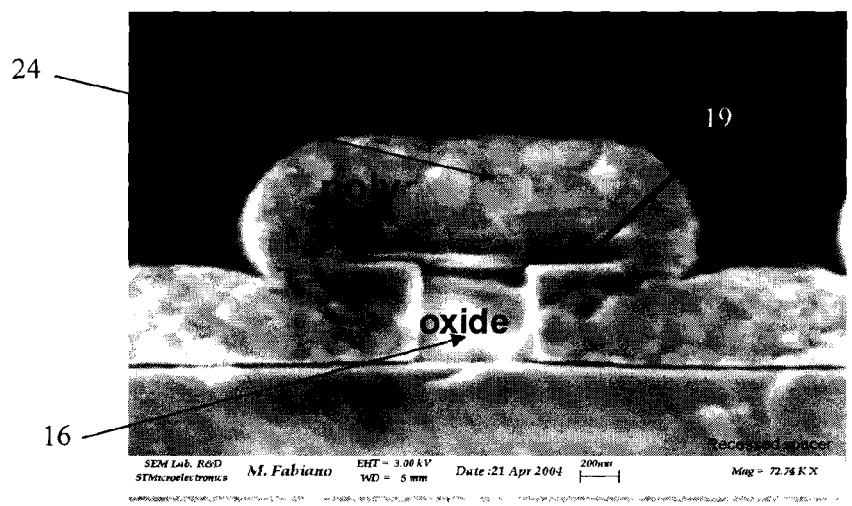
FIG. 10 shows an image obtained through scanning electronic microscopy [Scanning Electron Microscope] (SEM) of a layered structure of a power MOS device, in a step successive to that of FIG. 9 of a process for realizing the device according to an embodiment of the present invention.

FIG. 10 shows an image obtained by means of scanning electron microscopy [Scanning Electron Microscope] (SEM), of a layered structure of a power MOS device after the lateral etching of the thick dielectric layer 16 and the polysilicon 24 deposition.

Advantageously according to an embodiment of the invention, the self-alignment of the spacer 20 serving as gate electrode and especially the self-alignment of the body 12 and source 13 diffusions make the photolithography definition realizing the initial thick dielectric structure less critical.

In a first embodiment of the present invention described up to now the formation of the recess spacer 20 serving as gate electrode, occurs in a process carried out without masking. In a second embodiment, the formation of the recess spacer 20 serving as gate electrode occurs in a process with masking.

In consequence, on the basis of the second embodiment of the present invention, the method further provides the steps of: Providing a masking, by positioning a resist layer 23, of the regions which will lead to the formation of the transmission conductive layers 21.

Figure 11:
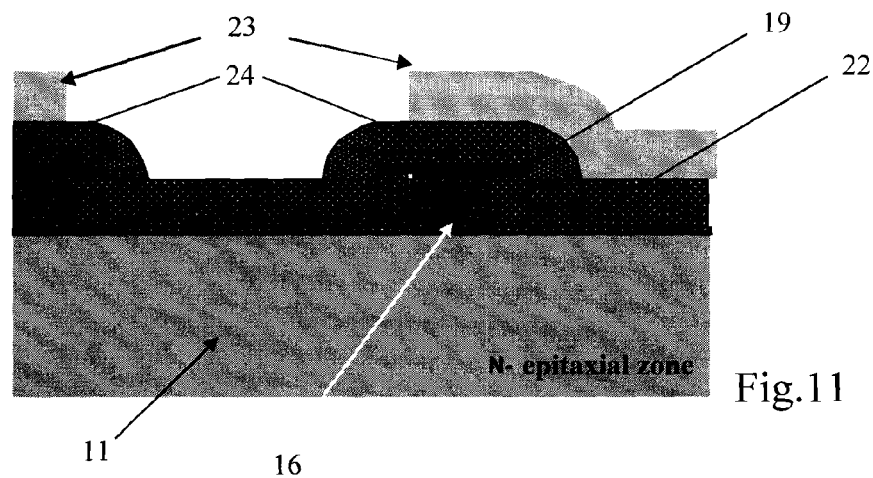
FIG. 11 shows an enlarged vertical section view of a layered structure of a power MOS device in another step of a process for realizing the device according to an embodiment of the present invention.

A section view of a layered structure of a power MOS device, further to the photomasking step described, is shown in FIG. 11.

anisotropic etching of the polysilicon 24 (masked spacer) and removal of the resist 23.

Suitably the process is carried out by means of an etching in plasma. By exploiting the high anisotropy it is possible to define, in a simultaneous way, the spacer 20 serving as gate electrode, in correspondence with the step created by the laterally etched thick dielectric layer 16 and the polysilicon transmission conductive layers 21, in the regions masked with the resist 23. For the etching process in plasma both the nitride portions 19 and the gate oxide thin layer 15 uncovered at the end of the process will be used as stopping layers (and for the endpoint reading).

Figure 12:
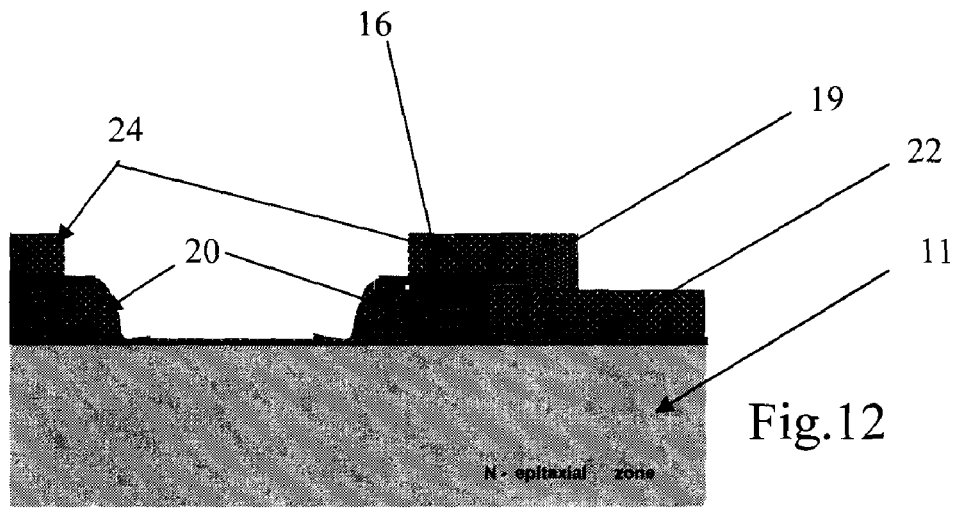
FIG. 12 shows an enlarged vertical section view of a layered structure of a power MOS device in a further step of a process for realizing the device according to an embodiment of the present invention.

An enlarged vertical section view of a layered structure of a power MOS device, further to the anisotropic etching step described is shown in FIG. 12.

Figure 13:
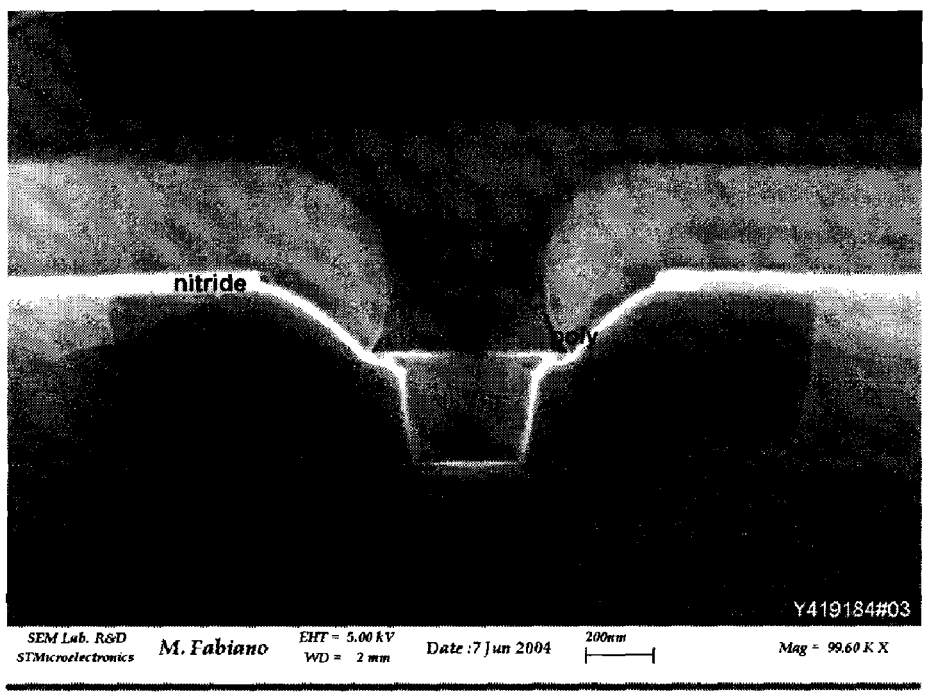
FIG. 13 shows a section obtained through scanning electron microscopy (SEM), of a layered structure of a power MOS device in a step of a process for realizing the device shown in FIG. 12 according to an embodiment of the present invention.

The corresponding polysilicon recess spacer 20 serving as gate electrode can be seen in FIG. 13, wherein a section is shown obtained by means of scanning electron microscopy (SEM), of a layered structure of a power MOS device, further to the anisotropic etching step described.

An advantage of the process proposed consists in the possibility of converting the polysilicon layer 24 on the thick dielectric into a suitable silicide (only by way of example cobalt silicide) in an almost complete way, without however risking damaging effects of the gate oxide or of mechanical stress.

The presence of a photolithographic operation dedicated to the realization of the transmission conductive layer (21) allows the addition or even substitution of the polysilicon 24 used with a metal (double metal structure) with enormous advantages on the device gate resistance.

Allowing reduction in the gate resistance, the process described can be applied to processes known in the literature, such as for example the one shown in the U.S. Pat. No. 5,933,734, which is incorporated herein by reference, wherein a gate mesh realized with a suitably doped polysilicon layer is placed in parallel to a layer with a lower resistivity (metal or a metallic silicide, such as cobalt silicide).

Only by way of example, the formation of the cobalt silicide can be realized by means of the following process steps according to a prior art process: Deposition of a deposited oxide layer (for example TEOS); masking process allowing to protect with resist the regions wherein the silicide will not have to be formed; dry etching process to eliminate the TEOS layer from the regions wherein the formation of a cobalt silicide layer and successive removal of the resist will occur; deposition of metallic cobalt by means of a sputtering process; and sintering processes for the formation of the silicide.

Processes according to embodiments of the invention solves the technical problem and it attains several advantages with respect to the prior art; the first of which is that of being compatible with the technologies VLSI.

These processes, in fact, do not require particular alignment restrictions between the various masks necessary for the formation of the elementary MOS, avoiding premature breakdown problems. The margin L shown in FIG. 2 of the prior art description is in fact ensured not by an alignment between the two masks but by a deposition and etching process.

The physical separation between the polysilicon of the transmission conductive layer (21) and the one placed on the gate oxide allows transforming the whole polysilicon thickness into a silicide without problems on the gate oxide (faultiness or mechanical stress).

The presence of a photolithographic operation dedicated to the realization of the transmission conductive layer (21) of a transistor mesh allows to add or even substitute the polysilicon used with a metal (double metal structure) with enormous advantages on the device gate resistance.

Power MOS devices as described in the above embodiments can be utilized in a variety of different types of electronic systems, such as automotive, control, and computer systems.

From the foregoing it will be appreciated that, although specific embodiments of the invention have been described herein for purposes of illustration, various modifications may be made without deviating from the spirit and scope of the invention.

The invention claimed is:

1. A high integration density power MOS device comprising a substrate of a doped semiconductor with a first type of conductivity whereon a semiconductor layer with lower conductivity is formed, transistor elementary structures Ti comprising body regions, arranged above in said semiconductor inside which the source regions are confined, characterised in that it comprises in each of said transistor elementary structures Ti a gate structure of the type with double thickness comprising a first thin layer of gate oxide onto which, at least partially, a dielectric layer is overlapped having thickness greater than said first layer and laterally delimited by lateral portions of conductive material, said gate structure further comprising a nitride upper portion above the thick dielectric layer and said lateral portions of conductor material.

2. A power MOS device, according to claim 1, wherein the MOS device comprises opposite spacers of the same conductor material aligned with said gate structure and with said body and source regions.

3. A power MOS device according to claim 2 wherein said spacer serves as gate electrode.

4. A power MOS device according to claim 2 wherein said gate structure is separated, by means of said nitride portion, from a transmission conductive layer of a transistors mesh.

5. A power MOS device according to claim 4, wherein said transmission conductive layer is realized in polysilicon.

6. A power MOS device according to claim 4, wherein said signal transmission conductive layer is realized with a silicide layer.

7. A power MOS device according to claim 4, wherein a metallic layer is overlapped onto said signal transmission conductive layer.

8. A power MOS device according to claim 4, wherein said signal transmission conductive layer is realized with a completely metallic layer.

9. A power MOS device according to claim 4, wherein said gate structure, distribute a biasing signal to transistor elementary structures, by means of said signal transmission conductive layer.

10. A power MOS device, comprising:
    a substrate including a first doped semiconductor layer having a first conductivity type and a second doped semiconductor layer having a second conductivity type formed on the first doped semiconductor layer; and
    a plurality of MOS transistors, each MOS transistor including,
        a body region formed in the second doped semiconductor layer and at least one source region formed in the body region;
        a gate structure including,
            a thin gate insulating layer;
            a thick gate insulating layer formed on the thin gate insulating layer;
            conductive spacers formed on lateral ends of the thick gate insulating layer, the spacers aligned with the gate structure and with the body and source regions; and
            an insulating upper layer formed on the thick dielectric layer and on the conductive spacers.

11. The power MOS device of claim 10 wherein the gate insulating layer comprises a gate oxide layer.

12. The power MOS device of claim 11 wherein the spacers comprise a gate electrode of each MOS transistor.

13. The power MOS device of claim 12 wherein the gate electrode further comprises a transmission layer formed on the insulating upper layer, the spacers being electrically coupled to the transmission layer.

14. An electronic system, comprising:
    electronic circuitry including a power MOS device, the power MOS device including,
        a substrate including a first doped semiconductor layer having a first conductivity type and a second doped semiconductor layer having a second conductivity type formed on the first doped semiconductor layer; and
        a plurality of MOS transistors, each MOS transistor including, a body region formed in the second doped semiconductor layer and at least one source region formed in the body region;
a gate structure including,
   a thin gate insulating layer;
   a thick gate insulating layer formed on the thin gate insulating layer;
   conductive spacers formed on lateral ends of the thick gate insulating layer, the spacers aligned with the gate structure and with the body and source regions; and
   an insulating upper layer formed on the thick dielectric layer and on the conductive spacers.

15. The electronic system of claim 14 wherein the electronic circuitry comprises automotive circuitry.

* * * * *